Jan. 19, 1960 K. C. NOMURA 2,921,362

PROCESS FOR THE PRODUCTION OF SEMICONDUCTOR DEVICES

Filed June 27, 1955

INVENTOR.
KAWORU C. NOMURA

BY Orvin M. Haugen

ATTORNEY 2,921,362

PROCESS FOR THE PRODUCTION OF SEMICONDUCTOR DEVICES

Kaworu Carl Nomura, Hopkins, Minn., assignor to Minneapolis-Honeywell Regulator Company, Minneapolis, Minn., a corporation of Delaware Application June 27, 1955, Serial No. 518,238

7 Claims. (Cl. 29—25.3)

The present invention relates to an improved semiconductor device and more particularly to a transistor type amplifier wherein the semiconductor body includes an intrinsic conductivity layer sandwiched between layers of definite conductivity types. The invention further contemplates the production of p-n-i-p or n-i-p-n junction type transistors which provide improved electrical performance over those possible with conventional type transistors due to the low capacitance losses occurring between the various conductivity layers separated by the intrinsic layer. More specifically, the invention relates to a vapor diffused p-n-i-p or n-i-p-n junction transistor. In the above terminology, p refers to a conductivity type wherein the electrical current carriers are predominantly "holes," that is to say it refers to a semiconductor body having its conductivity determined by electron acceptors distributed throughout its specific zone or structure. The designation "n" refers to electronic conductivity wherein the current carrying characteristics of the semiconductor zone are determined by the flow of electrons through the structure, the carriers being provided through the inclusion of electron donor impurities in the lattice structure of the semiconductor body. The designation "i" refers to intrinsic electrical conductivity of a semiconductor material, that is, the conductivity inherent in substantially pure semiconductor material.

Transistors of this type have been known previously, however, in accordance with the present device the unit is produced by vapor diffusion procedures, and superior electrical characteristics are achieved in this device as characterized by the extremely high $\alpha$ value or amplification factor of the transistor. The $\alpha$ value may be represented by the equation $$\alpha=\left(\frac{\partial I_c}{\partial I_e}\right)E_c=\text{const.}$$

Devices fabricated in accordance with the present invention have exhibited $\alpha$ values as high as 55. Other desirable electrical characteristics such as good high frequency response and high collector breakdown voltage are also achieved. The electrical characteristics of this device are similar to those of a conventional triode.

Briefly, the invention may be carried out in the following manner. A wafer of single crystalline semiconductor material is selected having sufficiently high purity such that it exhibits intrinsic electrical conductivity. The wafer has a pair of parallelly disposed major surfaces upon which the various preparation steps are carried out. An impurity substance which is capable of converting the electrical characteristics of the semiconductor material such that it exhibits a definite type of conductivity is introduced into at least one of the major faces of the wafer body. Vapor diffusion is preferable for this step, however other suitable methods of impurity introduction could be used. This is carried out in such a manner that the penetration depth is of a predetermined extent. A cavity is then formed in the wafer into the surface into which the impurity has been introduced, the cavity being of a depth which is less than the depth of penetration, thereby leaving a thin layer of doped semi-material between the surface of the semiconductor and the intrinsic layer. A second impurity introduction step is carried out in the form of a diffusion operation wherein an impurity source capable of rendering the semiconductor material of opposite conductivity type from the first introduction is subsequently diffused into both major faces of the body. This diffusion is carried out to such an extent that the depth of penetration of the second operation is somewhat less than the thickness of the layer which remains between the cavity surface and the intrinsic layer, however the concentration of the second impurity is sufficiently high to overcome the influence of the first impurity and the zone then exhibits the conductivity as determined by the second impurity. Electrode leads are then attached to the various portions of the member and the device is ready for operation. In order to make the first diffused layer accessible for purposes of electrode application, the shoulder portions surrounding the cavity are cut away a depth slightly greater than the thickness of the second diffusion layer, thus exposing a relatively broad area of semiconductor substance having a conductivity as influenced by the first diffusion operation. Thus, it is possible to attach electrodes to this relatively thin zone or layer over a relatively broad area without the need for probing along the edge of the device to find the proper location for electrode application. Since the thickness of this layer may lie in the range of a fraction of a mil up to a few mils, it is seen that the task of attaching a relatively large area electrode to this layer along its edge would be extremely difficult if not practically impossible. Further, a device of relatively high mechanical strength is provided, since the thin active zone is surrounded by an area of greater thickness.

It is therefore an object of the present invention to provide a transistor partially formed by vapor diffusion having a thin active zone including a plurality of layers of diffusing conductivity type surrounded by a relatively thick zone and having relatively broad surface areas for application of low resistance electrodes to each layer.

It is a further object of the present invention to provide a transistor body of improved electrical characteristics including an intrinsic conductivity layer in the semiconductor member by vapor diffusion methods.

It is still a further object of the present invention to provide a multi-layer transistor type amplifier of p-n-i-p or n-i-p-n configuration wherein the individual layers are of predetermined thickness and wherein relatively broad areas for application of electrode leads are available to the desired layer.

Other and further objects of the present invention will become apparent from the following description of the various embodiments thereof, reference being made to the accompanying drawings wherein.

Figures 1, 2, 3, 4, 5:
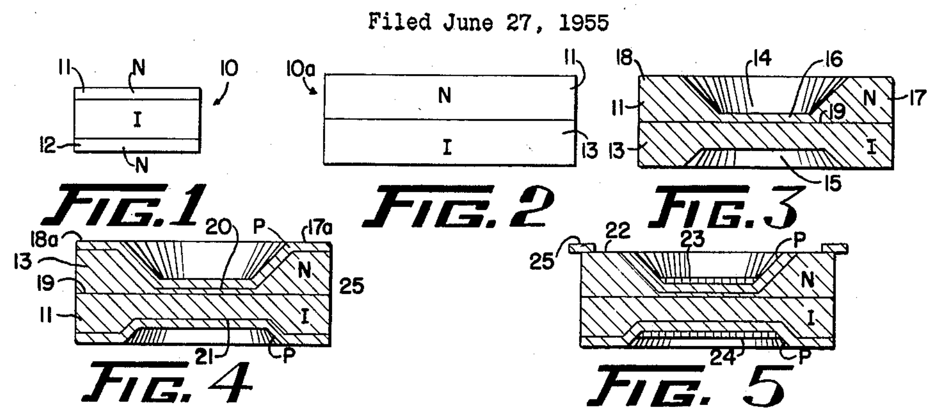
Figure 1 is a front view of a starting block which may be utilized in carrying out the present invention, and showing the extent to which the first or primary impurity introduction step has been carried out.
Figure 2 is a view on a slightly enlarged scale of one half of the starting block illustrated in Figure 1 after cutting the block shown in Figure 1 along the central plane thereof and forming a pair of identical wafers.
Figure 3 is a view similar to Figure 2 having the configuration of the device of Figure 6, likewise on a slightly enlarged scale showing the device of Figure 2 after formation of a cavity therein along the major faces thereof.
Figure 4 is a similar view of the device of Figure 2 likewise on a slightly enlarged scale showing the various diffused zones in the wafer after a second diffusion operation.
Figure 5 is a similar view of the device of the wafer shown in Figure 2 on a slightly enlarged scale after a lapping operation has been carried out to remove a portion of the second diffusion layer from the wafer, and thereby permitting more simplified application of electrode leads to the wafer body.

In accordance with the present invention, an intrinsically pure semiconductor body exhibiting intrinsic type conductivity is placed in an atmosphere containing an impurity capable of diffusion into the semiconductor body and further capable of providing the diffused portions with a definite electrical conductivity type. This conductivity type may be either "n" or "p," and in the case of n-type conductivity, a donor impurity such as antimony, phosphorous, or the like is utilized while for a p-type configuration, an acceptor type impurity such as indium, gallium, or the like is utilized. In the illustration of Figure 1, there is shown a semiconductor block generally designated 10 having a pair of "n" type zones diffused into opposite faces thereof designated 11 and 12. Throughout the present invention, reference will be made to various electrical characteristics and types, it is to be noted however that the reference to electrical characteristics includes such characteristics as n-type conductivity, p-type conductivity and "i" or intrinsic conductivity. Intrinsic conductivity in this specification is not intended to be a type of conductivity as distinguished from "p" type and "n" type, and where reference is made to a certain conductivity type, this type will normally be referred to as n-type or p-type. Intrinsic type semiconductor material is normally highly purified substance such as germanium or silicon. When germanium is utilized, a resistivity of about 40–60 ohm-centimeters is required before the material can be classed as intrinsic. The vapor diffused portion will, of course, have a substantially lower resistivity preferable in the range of 0.1–1 ohm-centimeters provided germanium is being used. The block is then split into two wafers such as shown in Figure 2 having an n-i junction zone at a predetermined depth in the wafer. After the block has been split into two wafers, a cavity is formed on at least one face of the body wherein a relatively narrow web of semiconductor material connects the heavier end portions of the wafer. Such an operation provides a device having a configuration shown as illustrated in Figure 3, this device having, at this stage, a pair of cavities 14 and 15 formed in the major faces thereof. This provides a thin web of semiconductor material 16 of definite thickness bridging and connecting the relatively heavier end or marginal portions 17 and 18. It is noted that the cavity on the diffused surface is at a depth slightly less than that of the diffused zone. Subsequent to the stage reached as shown in Figure 3, a second diffusion operation is carried out wherein the device is placed in a treating zone wherein an atmosphere of an acceptor type material such as indium is maintained. In this connection, the partially completed device is held in the atmosphere until diffusion progresses to a point or depth slightly less than that of original diffusion operation, leaving a layer of n-type material between the p-type material and the n-i junction as shown at 19. This operation provides a p-n junction zone 20 and a p-i junction 21 in addition to the n-i junction 19 formed by the previous operations. In carrying out this operation, it is preferable to utilize a diffusion temperature which is sufficiently high to assure rapid diffusion of the impurity into the previously formed body in order that the intrinsic junction, in this case the n-i junction at 19 continues to maintain its identity even after the second diffusion operation. The vapor pressure of the second impurity should be sufficiently high so that the influence of the first impurity is overcome. Therefore, if antimony has been used in the primary diffusion step, and if an indium atmosphere is used in the second diffusion operation, a temperature of about 820° C. is preferred for the second diffusion operation since this provides a sufficiently high vapor pressure for the indium and also assures relatively rapid diffusion of the indium into the germanium wafer without destroying or disturbing the n-i junction previously formed with antimony and intrinsic germanium. Crystals must be placed on flat surfaces of either graphite or quartz during heating. This is to prevent plastic deformation of the crystals which affects all structure sensitive properties of the semiconductor. Resistivity and lifetime of minority carriers are two of the major parameters which are affected by such structure changes.

Following the second diffusion operation wherein a device having the configuration of that shown in Figure 4 is provided, the outer portions of the end regions 17 and 18 as shown at **17*a* and 18*a* on the surface used for the primary diffusion step are removed by a lapping operation or the like to provide a device having the configuration as shown in Figure 5. This provides a relatively broad area 22 exposing a portion of the zone affected by the first diffusion operation. Of course, after the lapping operations, suitable electrode leads as those shown at 23, 24, and 25 are provided on the complete unit. The base electrode being at 25, the collector electrode at 24 and the emitter electrode at 23**.

Figure 6:
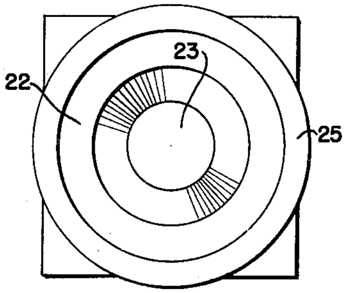
Figure 6 is a top plan view of the completed wafer showing the preferred configuration for the device of the present invention.
Figure 7:
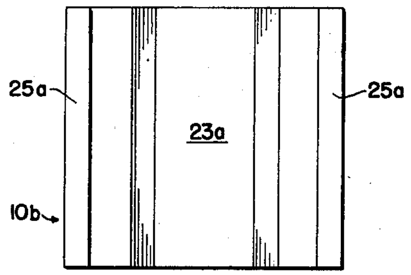
Figure 7 is a top plan view of a slightly modified geometrical construction for the present invention.

The modification illustrated in Figure 7 shows another form of cavity which may be formed in the crystal after the initial diffusion has been carried out. In this case, the cavity is in the form of a slot formed across the surface of the crystal body **10*b*. Conventional electrodes are applied to the device such as 23*a* and 25*a*—25*a*** in accordance with those of the device shown in Figure 6.

Of course, in actual practice, the device would have a smaller size than is shown in the drawings, however, due to limitations in draftsmanship, and for purposes of clarity, the units are shown somewhat out of actual proportion since a size of about ¼ inch by ¼ inch by 8 mils is utilized for the wafer **10*a***. The various diffusion zones in the accompanying drawings are likewise shown for purposes of illustration only and are not intended to be drawn to scale.

*Example 1*

Figure 8:
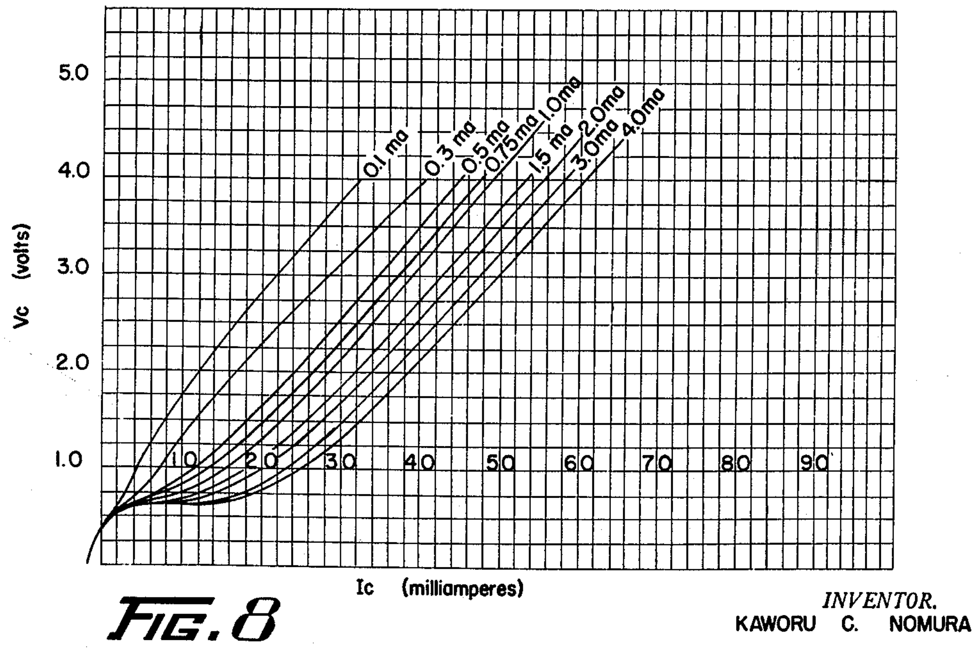
Figure 8 is a graph illustrating typical electrical characteristics obtained from a device fabricated in accordance with the present invention.

A block of single crystalline intrinsic germanium having a resistivity of from 40–50 ohm-centimeters is cut to a size of ¼" x ¼" x 30 mils, having the (111) plane oriented parallel to the major faces. This block is placed in an atmosphere of antimony vapor at a temperature of 800° C. for a period of 12 hours, this being sufficient to diffuse the antimony into the crystal a distance of about two mils in the direction parallel to the major faces. In this fashion, an n-i electrical junction at this depth across the body is formed. The diffused region exhibits a resistivity of about 0.1 ohm-centimeter after this operation. The block is masked at the edge surfaces to prevent diffusion into the edge faces, however it will be understood that in the absence of masking, a lapping or cutting operation may be utilized to remove material which could have diffused into the edge faces during the diffusion operation. The block is then split along its middle plane to form a pair of identical wafers or dice, each having an n-i junction located about 1 mil inwardly from a major face. The new face exposed by the cut is then lapped and etched with an etching solution including nitric acid, hydrofluoric acid, acetic acid, and bromine to prepare a smooth and true surface for subsequent operations. A cavity or slot about ½ mil deep is then routed out of the face of the diffused surface of the wafer, and a thin ribbon of n-type germanium ½ mil in thickness remains between the surface of the cavity and the n-i junction region. A similar cavity or slot is prepared in the opposite face of the wafer, in oppositely disposed relationship to the first slot to a depth which leaves a web region having a thickness of 2 mils. These cavities or slots are best formed by a fine routing operating but they may also be prepared by other methods, such as by etching or the like. The wafer has now assumed an "I" form or structure, having a pair of relatively heavy end portions separated by a thin web of material, and is at the stage of completion as shown in Figure 3 of the drawings. The edge surfaces are masked, and the wafer is then placed in a relatively strong indium atmosphere, being held at a temperature of 820° C. for a period of one hour. This is carried out under a pressure of about 1 micron Hg; this being the vapor pressure of indium at that temperature. Prior to placing of the partially completed device into the indium chamber; the chamber is heated and out gassed in order to make the atmosphere primarily that of the indium. Under these conditions, the indium diffuses rather rapidly into the germanium and moves inwardly a distance just slightly less than ½ mil, leaving a thin ribbon of n-type material between the "p" region and the "i" region. Under these conditions, the "n" region remaining has a thickness of about 0.1 mil. This region is shown at 25 in Figure 4. The thickness of this zone is rather critical to the operation of the device, and therefore requires rather close control during the second diffusion step. In order to make the "n" zone accessible for electrode attaching, the upper portion of the end regions as shown at 17*a* and 18*a* are lapped off to present a relatively broad area for attaching the electrode to the "n" region. Electrodes making low resistance contact with the device are then applied to the body, the base lead such as shown at 25 is attached by soldering or the like, and emitter and collector electrodes such as are shown at 23 and 24 are prepared by rhodium plating or the like. Of course, many other suitable methods of electrode application are available and useful in this regard. Figure 8 illustrates the characteristics of a typical transistor formed in accordance with the conditions given in this example, where $I_c$ is the collector current in milliamperes and $V_c$ is the collector voltage in volts. Each individual line is at a constant emitter current, $I_e$. The $\alpha$ values for these devices may range as high as 55. In a similar manner, transistors having other configurations such as n-p-i-n or the like may be prepared.

Many details of composition and procedure may be varied without departing from the principles of this invention, and it will therefore be understood that the examples and illustrations given herein are for the purpose of illustration only and are not to be construed as any limitation upon the invention. It is, therefore, not my purpose to limit the patent granted on this application otherwise than necessitated by the scope of the appended claims.

I claim as my invention:

1. The method of forming an asymmetrical conducting semiconductor device from a single-crystalline wafer having a pair of parallelly disposed major faces and having a plurality of layers of differing electrical conductivity characteristics between said faces including first and second surface adjacent layers of differing electrical conductivity characteristics the first layer being substantially intrinsically pure semiconductor material, the second layer having n-type conductivity and meeting said first layer at a first predetermined depth from the adjacent surface, said method including forming a cavity in a portion of the surface adjacent the n-type layer to a second predetermined depth which is less than said first predetermined depth, thereby forming a relatively thin web surrounded by a shoulder portion, and diffusing a p-type impurity source into each of said major faces and said cavity to a depth which is less than the difference between said first and said second predetermined depths, removing a layer of material from said shoulder portions to a depth sufficient to expose said n-type layer, and thence attaching relatively large area electrodes to portions of at least three of said layers including said n-type layer and each of said p-type faces.

2. The method of forming an asymmetrical conducting semiconductor device from a single-crystalline wafer having a pair of parallelly disposed major faces and having a plurality of layers of differing electrical conductivity characteristics between said faces including first and second surface adjacent layers of differing electrical conductivity characteristics the first layer being substantially intrinsically pure semiconductor material, the second layer having p-type conductivity and meeting said first layer at a first predetermined depth from the adjacent surface, said method including forming a cavity in a portion of the surface adjacent the p-type layer to a second predetermined depth which is less than said first predetermined depth, thereby forming a relatively thin web surrounded by a shoulder portion and diffusing an n-type impurity source into each of said major faces and said cavity to a depth which is less than the difference between said first and said second predetermined depths, removing a layer of material from said shoulder portions to a depth sufficient to expose said p-type layer, and thence attaching relatively large area electrodes to portions of at least three of said layers including said p-type layer and each of said n-type faces.

3. The method of forming a transistor amplifier body including a plurality of zones of differing electrical conductivity characteristics which includes the steps of diffusing a first impurity substance which provides a certain conductivity type to a semiconductor body into one major surface of a substantially intrinsically pure semiconductor wafer having a pair of major faces until a first predetermined depth of diffusion is reached, forming a cavity in a portion of said surface to a second predetermined depth which is less than said first predetermined depth, thereby leaving the remaining surface portion as a shoulder area, and diffusing a second impurity substance which renders the body substantially opposite in its conductivity type from that provided by said first substance into each of said major faces and cavity to a depth which is less than the difference between said first and said second predetermined depths removing the diffused layer from said shoulder area to expose an area of said body having said certain conductivity type, and applying relatively large area electrode leads to at least three of said layers.

4. The method of forming a transistor amplifier body including a portion having a plurality of layers of differing conductivity characteristics which includes the steps of diffusing a first impurity substance into one major surface of a substantially intrinsically pure semiconductor wafer having a pair of major faces, rendering a certain conductivity type to said semiconductor wafer throughout a first predetermined depth, forming a cavity in a portion of the area of said surface to a second predetermined depth which is substantially less than said first predetermined depth, thereby leaving the remaining area as a shoulder portion, and diffusing a second impurity which forms zones of substantially opposite conductivity type into opposite surfaces of said wafer including said cavity to a depth which is slightly less than the difference between said first and said second predetermined depths, said second impurity being in sufficient quantity so as to overcome the effect of said first impurity throughout a portion of said first predetermined depth and attaching relatively large area electrodes to at least three of said layers.

5. The method of forming a transistor amplifier body comprising a substantially intrinsically pure germanium semiconductor wafer with a pair of major surfaces and with a portion having a plurality of layers of differing conductivity characteristics which includes the steps of diffusing a quantity of n-type impurity to a first predetermined depth into a first major surface of said germanium wafer, forming a cavity in a portion of the area of said first major surface to a second predetermined depth which is less than said first predetermined depth, thereby leaving the remaining area as a shoulder portion, thence diffusing a quantity of p-type impurity into each of said major faces a depth which is less than the difference between said first and said second predetermined depths and attaching a relatively large area electrode to said n-type layer at said shoulder portion and attaching relatively large area electrodes to said p-type surface faces.

6. The method of forming a transistor amplifier body comprising a plurality of zones of differing conductivity characteristics which includes the steps of diffusing a first impurity which renders a first conductivity type to a semiconductor body a first predetermined depth into a surface of a substantially intrinsically pure semiconductor wafer, thereby forming a first diffused zone, forming a cavity in a portion of the area of said surface to a second predetermined depth which is less than said first predetermined depth, thereby leaving the remaining area as a shoulder portion surrounding said cavity, diffusing a second impurity substance which renders the zones wherein it diffuses substantially opposite in conductivity type into each of said major faces a distance which is less than the difference between said first and said second predetermined distances, thereby forming a second diffused zone, removing a portion of said second diffused zone along said shoulder portion to a depth which exposes a portion of said first diffused zone on the surface of said wafer and thence attaching a relatively large area electrode to said shoulder portion and a pair of relatively large area electrodes to each of said major faces having said opposite conductivity type.

7. A method of forming a semiconductor asymmetrical conducting device having a plurality of layers of various conductivity types which includes the steps of providing a wafer of semiconductor material with a certain first conductivity characteristic and having a pair of major surfaces in parallelly disposed relationship, forming a cavity in at least one of said major surfaces to form a relatively thin web of material of predetermined thickness bounded by relatively thick shoulder portions and including a layer of material having said certain first electrical conductivity characteristic, diffusing an impurity substance which renders said body of substantially opposite conductivity type into the major surfaces of said wafer including said web portion to a depth of penetration which is less than one-half of said predetermined thickness to form a plurality of junctions therein, removing a film of material from said shoulder portion to expose material having said first conductivity type and then applying relatively large area surface electrodes to each of said layers.

References Cited in the file of this patent

UNITED STATES PATENTS

| | | |
|---|---|---|
| 2,561,411 | Pfann | July 24, 1951 |
| 2,644,852 | Dunlap | July 7, 1953 |
| 2,666,814 | Shockley | July 19, 1954 |
| 2,694,024 | Bond et al. | Nov. 9, 1954 |
| 2,725,316 | Fuller | Nov. 29, 1955 |
| 2,727,840 | Teal | Dec. 20, 1955 |
| 2,752,315 | Fuller | Nov. 29, 1955 |
| 2,767,358 | Early | Oct. 16, 1956 |
| 2,793,145 | Clarke | May 21, 1957 |
| 2,829,992 | Gudmundsen et al. | Apr. 8, 1958 |

FOREIGN PATENTS

| | | |
|---|---|---|
| 1,080,034 | France | May 26, 1954 |

OTHER REFERENCES

The Bell Systems Technical Journal, volume 33, May 1954, No. 3, pages 517–533. (Pages 524 and 531 relied on.)